(12) United States Patent
Xu et al.

(10) Patent No.: US 10,998,522 B2
(45) Date of Patent: May 4, 2021

(54) FLEXIBLE OLED DISPLAY PANEL, MANUFACTURING METHOD FOR THE SAME AND DISPLAY DEVICE

(71) Applicant: Wuhan China Star Optoelectronics Semiconductor Display Technology Co., Ltd., Hubei (CN)

(72) Inventors: Jie Xu, Hubei (CN); Tao Sun, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 372 days.

(21) Appl. No.: 16/084,913

(22) PCT Filed: Jul. 19, 2018

(86) PCT No.: PCT/CN2018/096231
§ 371 (c)(1),
(2) Date: Sep. 13, 2018

(87) PCT Pub. No.: WO2019/205305
PCT Pub. Date: Oct. 31, 2019

(65) Prior Publication Data
US 2020/0335719 A1    Oct. 22, 2020

(30) Foreign Application Priority Data

Apr. 28, 2018 (CN) .......................... 201810404651.5

(51) Int. Cl.
*H01L 51/56* (2006.01)
*H01L 51/00* (2006.01)
(Continued)

(52) U.S. Cl.
CPC ...... *H01L 51/5253* (2013.01); *H01L 27/3246* (2013.01); *H01L 27/3258* (2013.01);
(Continued)

(58) Field of Classification Search
CPC ............... Y02E 10/549; H01L 27/3258; H01L 27/3244; H01L 51/5253; H01L 51/0097;
(Continued)

(56) References Cited

U.S. PATENT DOCUMENTS

2009/0278449 A1* 11/2009 Choi .................... H01L 27/3244
                                                                        313/504
2015/0102316 A1*  4/2015 Park .................... H01L 27/3262
                                                                        257/40
(Continued)

FOREIGN PATENT DOCUMENTS

CN         104241550 A       12/2014
CN         106873839 A        6/2017
(Continued)

*Primary Examiner* — Caridad Everhart
(74) *Attorney, Agent, or Firm* — Leong C. Lei

(57) ABSTRACT

A flexible OLED display panel is disclosed. The panel includes a flexible substrate, multiple pixel units disposed on the flexible substrate and arranged as a matrix, and a thin-film encapsulation covering on the multiple pixel units, wherein the flexible substrate is provided with a water-oxygen barrier layer, the multiple pixel units are located on the water-oxygen barrier layer, a spacer wall is disposed between any two adjacent pixel units, the spacer wall is integrally formed with the water-oxygen barrier layer, in a thickness direction of a flexible OLED display panel, and the spacer wall is extended to the thin-film encapsulation layer from the water-oxygen barrier layer. The present invention also discloses a manufacturing method for flexible OLED display panel and a display device including the flexible OLED display panel as described above. The invention can (Continued)

improve the stress release capability of the flexible OLED display panel when being bent.

20 Claims, 4 Drawing Sheets

(51) Int. Cl.
*H01L 27/32* (2006.01)
*H01L 51/52* (2006.01)

(52) U.S. Cl.
CPC .......... *H01L 51/0097* (2013.01); *H01L 51/56* (2013.01); *H01L 2227/323* (2013.01); *H01L 2251/5338* (2013.01)

(58) Field of Classification Search
CPC ............... H01L 51/56; H01L 2227/323; H01L 2227/326; H01L 51/5237; H01L 51/5256; H01L 27/3246; H01L 21/78; H01L 21/76898; H01L 21/76831; H01L 21/56; H01L 21/76805; H01L 21/76
See application file for complete search history.

(56) References Cited

U.S. PATENT DOCUMENTS

| | | |
|---|---|---|
| 2016/0043348 A1 | 2/2016 | Zhang |
| 2016/0293883 A1* | 10/2016 | Hong .................. H01L 51/5246 |
| 2017/0012225 A1* | 1/2017 | Heo ..................... H01L 51/0043 |
| 2017/0141169 A1* | 5/2017 | Sim ..................... H01L 27/3258 |
| 2018/0212060 A1* | 7/2018 | Kang .................. H01L 51/5234 |

FOREIGN PATENT DOCUMENTS

| | | |
|---|---|---|
| CN | 107369780 | 11/2017 |
| CN | 107425126 | 12/2017 |

* cited by examiner

FLEXIBLE OLED DISPLAY PANEL, MANUFACTURING METHOD FOR THE SAME AND DISPLAY DEVICE

RELATED APPLICATIONS

The present application is a National Phase of International Application Number PCT/CN2018/096231, filed Jul. 19, 2018, and claims the priority of China Application No. 201810404651.5, filed Apr. 28, 2018.

FIELD OF THE INVENTION

The present invention relates to the display technology field, and more particularly to a flexible OLED display panel and a manufacturing method for the same, and a display device.

BACKGROUND OF THE INVENTION

The Organic light-emitting diode (OLED) display panel has the advantages of self-luminescence, high contrast, thin thickness, wide viewing angle and fast response speed. The OLED display panel is a representative of the new generation of flat display technology and increasingly being accepted by the industry. The flexible OLED display panel is an important development trend among them.

The flexible OLED display panel not only can be thinner and lighter in volume, but also can reduce power consumption, thereby helping to improve the endurance of the corresponding product. At the same time, because the bending ability and flexibility of the flexible OLED display panel, it is also more durable than ordinary hard display panels. The flexible OLED display panel can be widely used in various products with display functions, such as tablet computers, televisions, mobile terminals, and various types of wearable devices.

Generally, when the flexible OLED display panel is bent, a stress is generated, wherein the tensile stress is generated toward the convex outer surface and the compressive stress is generated toward the concave inner surface. How to improve the stress release capability of a flexible OLED display panel when it is bent is a problem that needs to be solved in the industry.

SUMMARY OF THE INVENTION

In view of this, the present invention provides a flexible OLED display panel and a manufacturing method for the same to improve the stress release capability of a flexible OLED display panel when it is bent.

In order to achieve the above object, the present invention adopts the following technical solutions:

A flexible OLED display panel, comprising: a flexible substrate and multiple pixel units disposed on the flexible substrate and arranged as a matrix, and a thin-film encapsulation covering on the multiple pixel unit, wherein the flexible substrate is provided with a water-oxygen barrier layer, the multiple pixel units are located on the water-oxygen barrier layer, a spacer wall is disposed between any two adjacent pixel units, the spacer wall is integrally formed with the water-oxygen barrier layer, in a thickness direction of a flexible OLED display panel, and the spacer wall is extended to the thin-film encapsulation layer from the water-oxygen barrier layer.

Wherein the thin-film encapsulation layer includes an organic thin-film layer and an inorganic thin-film layer which are alternately laminated, and the spacer wall is embedded into the thin-film encapsulation layer.

Wherein materials of the water-oxygen barrier layer and the spacer wall are both organic materials.

Wherein a longitudinal cross section of the spacer wall has a trapezoidal shape.

Wherein a slope angle of a side of the spacer wall is α, and a preferred setting range of the slope angle α is $80°\leq\alpha<90°$.

Wherein the pixel unit includes a thin-film transistor and an organic light-emitting diode electrically connected to each other, the thin-film transistor is formed on the water-oxygen barrier layer, and the organic light-emitting diode is located on the thin-film transistor.

Wherein the thin-film transistor comprises: an active layer formed on the water-oxygen barrier layer; a gate insulation layer covered on the active layer; a gate electrode formed on the gate insulation layer; an interlayer dielectric layer covered on the gate electrode; a source electrode and a drain electrode formed on the interlayer dielectric layer; and a planarization layer disposed on the source electrode and the drain electrode.

Wherein the organic light-emitting diode comprises: a first electrode formed on the thin-film transistor and electrically connected to the thin-film transistor; a pixel definition layer disposed around the first electrode; an organic light-emitting layer formed on the first electrode; and a second electrode formed on the organic light-emitting layer.

The present invention further provides a manufacturing method for the flexible OLED display panel, comprising steps of: forming an organic material film layer on a flexible substrate; using a photolithography process to etch the organic material film layer to form a water-oxygen barrier layer and multiple patterned spacer walls protruding on the water-oxygen barrier layer; preparing multiple pixel units arranged as a matrix on the water-oxygen barrier layer, and any two adjacent pixel units are spaced apart from each other by the spacer wall; and forming a thin-film encapsulation layer on the multiple pixel units.

Another aspect of the present invention provides a display device, comprising: a driving unit and the OLED display panel described above, wherein the driving unit provides a driving signal to the OLED display panel to enable the OLED display panel to display an image.

The flexible OLED display panel and the display device provided by the embodiments of the present invention are provided with a spacer wall between any two adjacent pixel units, one end of the spacer wall is connected to the water-oxygen barrier layer at the bottom, and the other end is connected to the film encapsulation layer at the top. When the flexible OLED display panel is bent, the stress generated inside thereof is released on the spacer wall, thereby improving the bending performance of the flexible OLED display panel. In a further embodiment, the spacer wall is made of the same material as the water-oxygen barrier layer and is an integrally formed structure. The spacer wall also has the property of blocking moisture and oxygen, thereby also improving the water-oxygen barrier performance of the flexible OLED display panel. In addition, since a spacer wall is provided between any two adjacent pixel units, the signal interference between two adjacent pixel units can also be reduced.

DETAILED DESCRIPTION OF PREFERRED EMBODIMENTS

Figure 1:
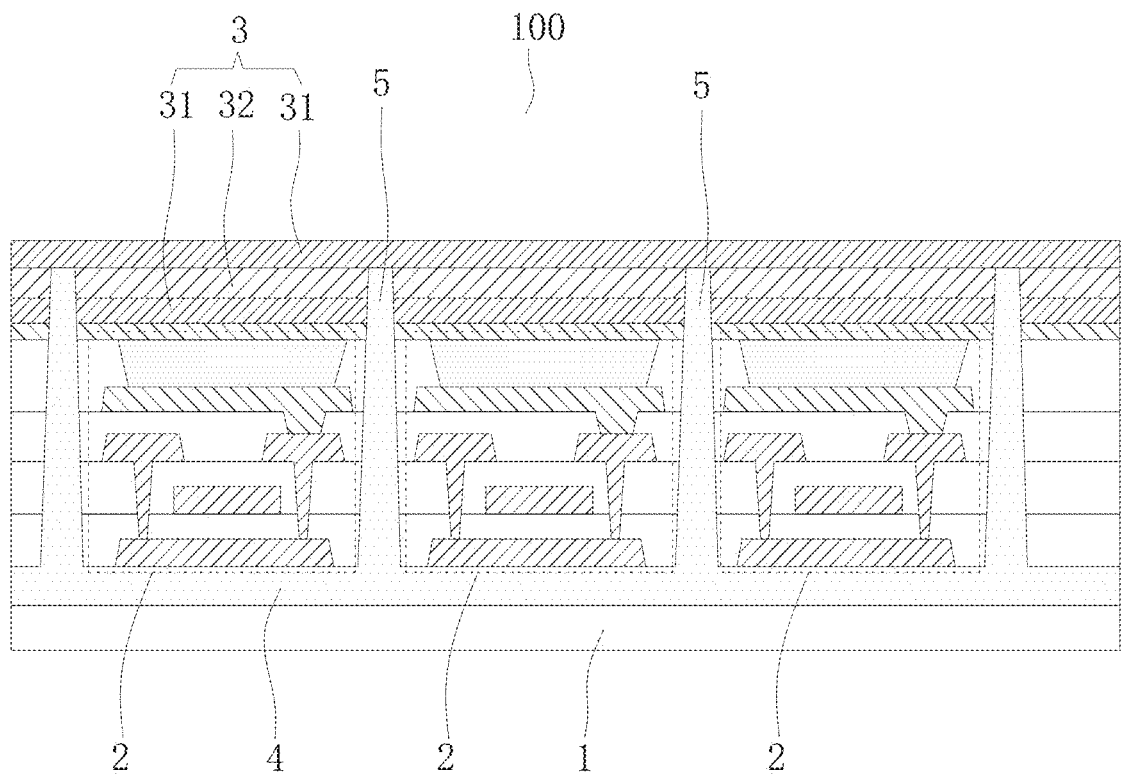
FIG. 1 is a schematic structural diagram of a flexible OLED display panel according to an embodiment of the present invention.

The embodiments of the present invention will be described in detail below with reference to the accompanying drawings. Examples of these preferred embodiments are illustrated in the drawings. The embodiments of the invention shown in the drawings and described in the drawings are merely exemplary, and the invention is not limited to the embodiments.

In this context, it is also to be noted that in order to avoid obscuring the invention by unnecessary detail, only the structures and/or processing steps closely related to the solution according to the invention are shown in the drawings, and the other details that are not relevant to the present invention are omitted.

The present embodiment provides a flexible OLED display panel. As shown in FIG. 1, the flexible OLED display panel 100 includes a flexible substrate 1 and multiple pixel units 2 (only exemplary shown some pixel units 2 in FIG. 1) disposed on the flexible substrate 1 and arranged as a matrix, and a thin-film encapsulation (TFE) 3 covering on the multiple pixel unit 2. Wherein, the flexible substrate 1 is provided with a water-oxygen barrier layer 4, the multiple pixel units 2 are located on the water-oxygen barrier layer 4, and a spacer wall 5 is disposed between any two adjacent pixel units 2. Specifically, the spacer wall 5 is connected to the water-oxygen barrier layer 4 and is integrally formed with the water-oxygen barrier layer 4, and in a thickness direction of the flexible OLED display panel 100, one end of the spacer wall 5 is connected with the water-oxygen barrier layer 4, and the other end of the spacer wall 5 extends to the thin-film encapsulation layer 3 and is embedded in the thin-film encapsulation layer 3.

The flexible OLED display panel 100 as described above is provided with the spacer wall 5 between any two adjacent pixel units 2, one end of the spacer wall 5 is connected to the water-oxygen barrier layer 4 at a bottom, and the other end of the spacer wall 5 is extended to the thin-film encapsulation layer 3 at a top, when the flexible OLED display panel 100 is bent, the stress generated inside is released on the spacer wall 5, thereby improving the bending performance of the flexible OLED display panel 100. In addition, because the spacer wall 5 are provided between any two adjacent pixel units 2, signal interference between the adjacent two pixel units 2 can also be reduced.

Wherein, in this embodiment, the materials of the water-oxygen barrier layer 4 and the spacer wall 5 are both organic materials. The spacer wall 5 employs a same organic material having the function of blocking water vapor and oxygen as the water-oxygen barrier layer 4, and both are integrally formed. Thereby, the water-oxygen barrier performance of the flexible OLED display panel 100, in particular, the water oxygen barrier property at a side of the pixel unit 2, is improved.

Figure 2:
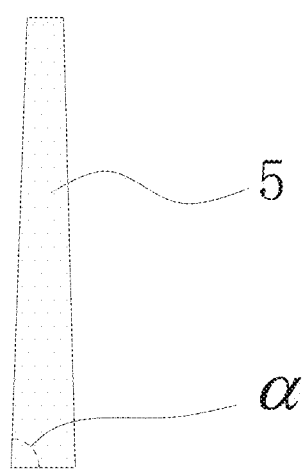
FIG. 2 is a schematic structural diagram of a spacer wall in an embodiment of the present invention.

Specifically, as shown in FIGS. 1 and 2, a longitudinal cross section of the spacer wall 5 has a trapezoidal shape. A slope angle of a side of the spacer wall 5 is $\alpha$, and a preferred setting range of the slope angle $\alpha$ is $80° \leq \alpha < 90°$.

Wherein, the flexible substrate 1 may be made of polymer materials such as polyimide (PI), polycarbonate (PC), polyether sulfone (PES), polyethylene terephthalate (PET), polyethylene naphthalate (PEN), a polyaryl compound (PAR) or a glass fiber reinforced plastic (FRP).

Figure 3:
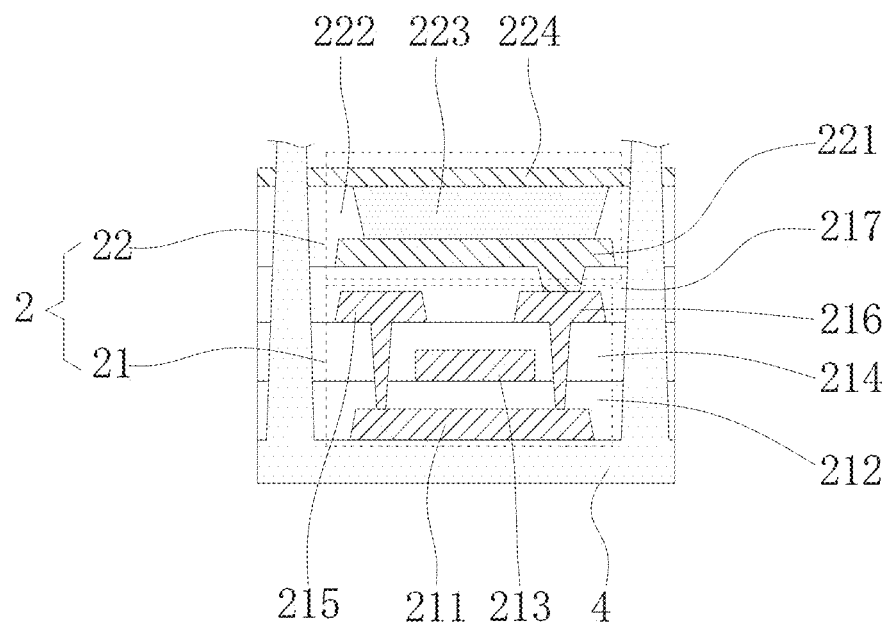
FIG. 3 is a schematic structural diagram of a pixel unit in an embodiment of the present invention.

Wherein, with reference to FIG. 1 and FIG. 3, the pixel unit 2 includes a thin-film transistor 21 and an organic light-emitting diode 22 electrically connected to each other, the thin-film transistor 21 is formed on the water-oxygen barrier layer 4, and the organic light-emitting diode 22 is located on the thin-film transistor 21.

Specifically, as shown in FIG. 3, the thin-film transistor 21 includes an active layer 211 formed on the water-oxygen barrier layer 4, a gate insulation layer 212 covered on the active layer 211, a gate electrode 213 formed on the gate insulation layer 212, an interlayer dielectric layer 214 covered on the gate electrode 213, a source electrode 215 and a drain electrode 216 formed on the interlayer dielectric layer 214, and a planarization layer 217 disposed on the source electrode 215 and the drain electrode 216. The gate electrode 213 is formed on the gate insulation layer 212 and disposed opposite to the active layer 211, and the source electrode 215 and the drain electrode 216 are formed at an interval on the interlayer dielectric layer 214, and the source electrode 215 and the drain electrode 216 are respectively connected to two terminals of the active layer 211 through via holes provided in the interlayer dielectric layer 214 and the gate insulation layer 212.

Specifically, as shown in FIG. 3, the organic light-emitting diode 22 includes: a first electrode 221 formed on the thin-film transistor 21 and electrically connected to the thin-film transistor 21, a pixel definition layer 222 disposed around the first electrode 221, an organic light-emitting layer 223 formed on the first electrode 221, and a second electrode 224 formed on the organic light-emitting layer 223. The first electrode 221 is formed on the planarization layer 217 and electrically connected to the thin-film transistor 21 through a via hole disposed in the planarization layer 217. In this embodiment, the first electrode 221 is a drain electrode 216 electrically connected to the thin-film transistor 21. The pixel definition layer 222 has an opening region, and the organic light-emitting layer 223 is formed on the first electrode 221 and located in the opening region of the pixel definition layer 222.

Wherein, the organic light-emitting layer 223 generally includes a hole injection layer (HIL), a hole transport layer (HTL), and a emissive layer (EML), an electron transport layer (ETL), and an electron injection Layer (EIL) which are sequentially disposed on the first electrode 221. The second electrode 224 is connected to the electron injection layer.

Furthermore, when the emissive layer in the organic light-emitting layer 223 is selected as an organic light-emitting material capable of emitting a red light, the pixel unit 2 corresponds to a red pixel unit; when the emissive layer in the organic light-emitting layer 223 is selected as an organic light-emitting material capable of emitting a green light, the pixel unit 2 corresponds to a green pixel unit; when the emissive layer in the organic light-emitting layer 223 is selected as an organic light-emitting material capable of emitting a blue light, the pixel unit 2 corresponds to a blue pixel unit.

Wherein, as shown in FIG. 1, the thin-film encapsulation layer 3 includes an organic thin-film layer 31 and an inorganic thin-film layer 32 which are alternately laminated. The thin-film encapsulation layer 3 shown in FIG. 1 includes two organic thin-film layers 31 and an inorganic thin-film layer 32 between the two organic thin-film layers 31. The spacer wall 5 may extend to any one of the thin-film layers of the thin-film encapsulation layer 3. For example, in FIG. 1, the spacer wall 5 is embedded in the inorganic thin-film layer 32 and extends to a connection interface of the inorganic thin-film layer 32 and the organic thin-film layer 31 located above the inorganic thin-film layer 32.

Furthermore, in the flexible OLED display panel 100, the thin-film encapsulation layer 3 may further provide with other functional structure film layers such as a touch panel (TP), a polarizer, and a protective cover.

Figure 4A:
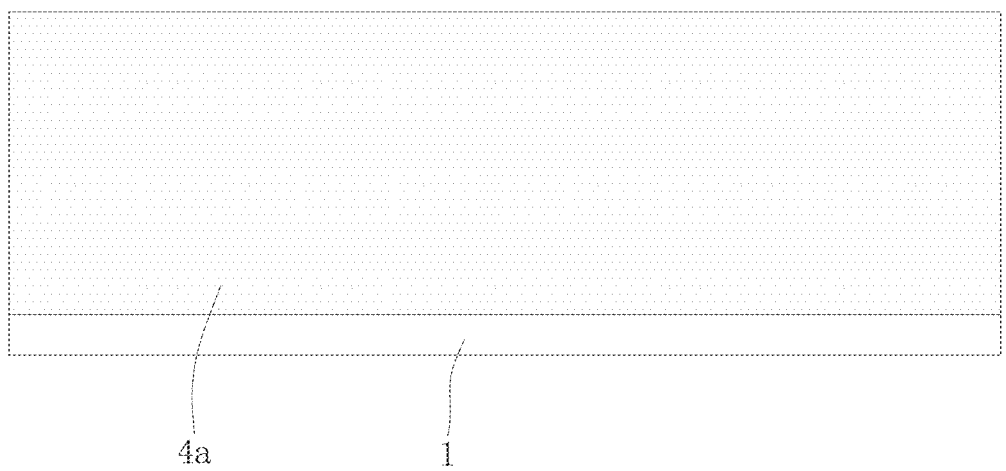
FIG. 4a-FIG. 4e are exemplary illustration diagrams of device structures obtained by corresponding steps in a manufacturing method for flexible OLED display panel according to an embodiment of the present invention.

Hereinafter, a manufacturing method for the flexible OLED display panel as described above will be described with reference to FIG. 4a to FIG. 4e and in conjunction with FIG. 1, which includes the following steps:

S101, as shown in FIG. 4a, forming an organic material film layer 4a on a flexible substrate 1.

Figure 4B:
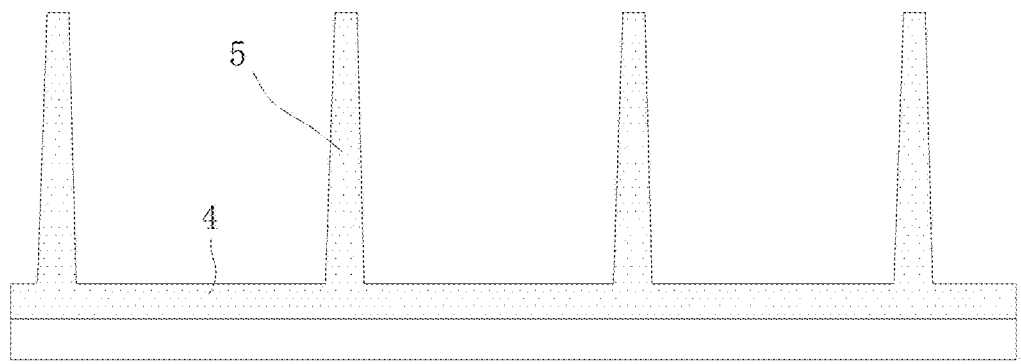

S102, as shown in FIG. 4b, using a photolithography process to etch the organic material film layer 4a to form a water-oxygen barrier layer 4 and multiple patterned spacer walls 5 protruding on the water-oxygen barrier layer 4.

Figure 4C:
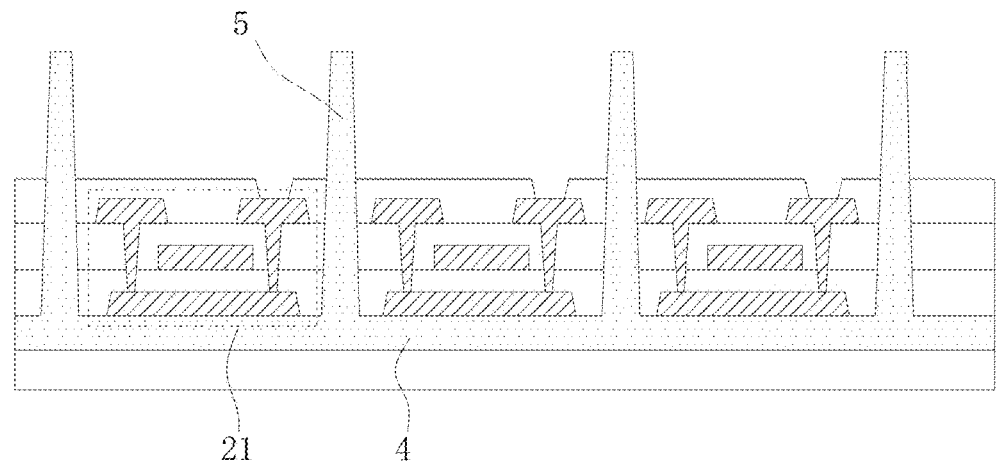
Figure 4D:
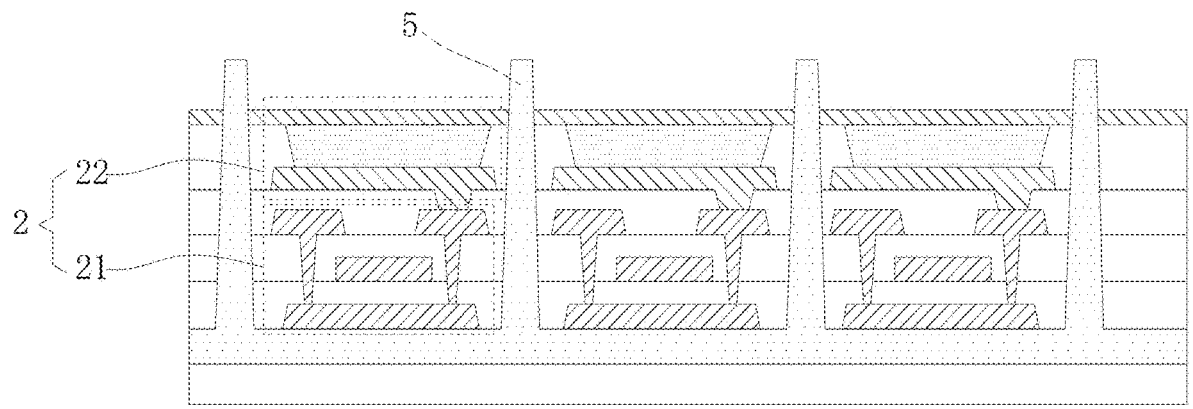

S103, as shown in FIGS. 4c and 4d, preparing multiple pixel units 2 arranged as a matrix on the water-oxygen barrier layer 4, and any two adjacent pixel units 2 are spaced apart from each other by the spacer wall 5. Specifically, as shown in FIG. 4c, firstly, sequentially forming layers of the thin film transistor 21 on the water-oxygen barrier layer 4 and in a region surrounded by the adjacent spacer walls 5, and then sequentially forming layers of the organic light-emitting diode 22 on the thin-film transistor and in the region surrounded by the adjacent spacer walls 5.

Figure 4E:
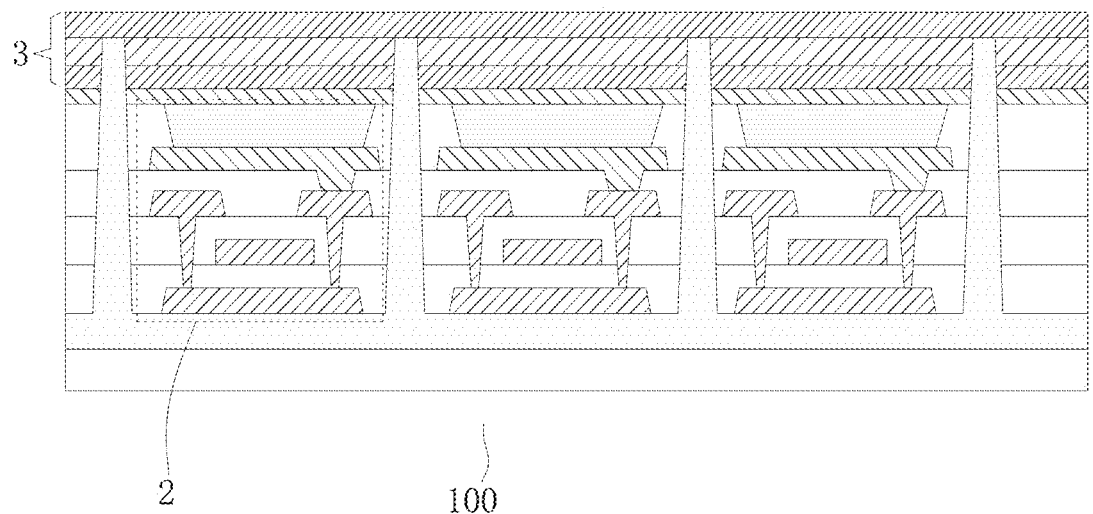

S104, as shown in FIG. 4e, forming a thin-film encapsulation layer 3 on the multiple pixel unit 2, and the thin-film encapsulation layer 3 covers each pixel unit 2, thereby the flexible OLED display panel 100 in the embodiment is obtained.

In the step S101, a thickness of the organic material film layer 4a needs to be specifically set according to a thickness of the flexible OLED display panel 100 to be finally prepared, so that the spacer wall 5 formed by etching the organic material film layer 4a has a sufficient height to ensure that one end of the spacer wall 5 is connected to the water-oxygen barrier layer 4 at the bottom, and the other end is extended to the film encapsulation layer 3 at the top and is embedded in the thin-film encapsulation layer 3.

Figure 5:
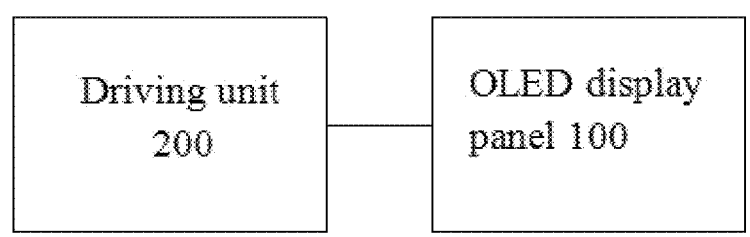
FIG. 5 is a schematic structural diagram of a display device according to an embodiment of the present invention.

The present embodiment provides a display device. As shown in FIG. 5, the display device includes a driving unit 200 and an OLED display panel 100. The driving unit 200 provides a driving signal to the OLED display panel 100 to enable the OLED display panel 100 to display an image. The OLED display panel 100 employs the flexible OLED display panel of the above embodiment of the present invention.

In summary, the flexible OLED display panel and the display device provided by the embodiments of the present invention, through providing a spacer wall between any two adjacent pixel units, the present invention cannot only improve the bending performance of the flexible OLED display panel but also increase the water-oxygen barrier performance of the flexible OLED display panel and reduce the signal interference between two adjacent pixel units at the same time.

It should be noted that, herein, relational terms such as first and second, and the like are only used to distinguish one entity or operation from another entity or operation. It is not required or implied that these entities or operations exist any such relationship or order between them. Moreover, the terms "comprise," include," or any other variation thereof, are intended to cover a non-exclusive inclusion, such that a series of elements including the process, method, article or device that includes not only those elements but also other elements not expressly listed or further comprising such process, method, article or device inherent elements. Without more constraints, by the statement "comprises one" element defined does not exclude the existence of additional identical elements in the process, method, article, or apparatus.

The above description is only a specific embodiment of the present application, and it should be noted that those skilled in the art can also make some improvements and retouching without departing from the principle of the present application. It should be considered as the scope of protection of this application.

What is claimed is:

1. A flexible OLED display panel, comprising:
   a flexible substrate, multiple pixel units disposed on the flexible substrate and arranged as a matrix, and a thin-film encapsulation layer covering on the multiple pixel units, wherein the flexible substrate is provided with a water-oxygen barrier layer, the multiple pixel units are located on the water-oxygen barrier layer, a spacer wall is disposed between any two adjacent pixel units, the spacer wall is integrally formed with the water-oxygen barrier layer, in a thickness direction of a flexible OLED display panel, and the spacer wall is extended to the thin-film encapsulation layer from the water-oxygen barrier layer; and
   wherein the thin-film encapsulation layer is located on a top side of the multiple pixel units and the water-oxygen barrier layer is located on a bottom side of the multiple pixel units that is opposite to the top side; and
   wherein the spacer wall has a lower end connected to the water-oxygen barrier layer located on the bottom side of the multiple pixel units, and the spacer wall has an upper end extended beyond the multiple pixel units to connect to the thin-film encapsulation layer located on the top side of the multiple units.

2. The flexible OLED display panel according to claim 1, wherein the thin-film encapsulation layer includes an organic thin-film layer and an inorganic thin-film layer which are alternately laminated, and the spacer wall is embedded into the thin-film encapsulation layer.

3. The flexible OLED display panel according to claim 1, wherein materials of the water-oxygen barrier layer and the spacer wall are both organic materials.

4. The flexible OLED display panel according to claim 1, wherein a longitudinal cross section of the spacer wall has a trapezoidal shape.

5. The flexible OLED display panel according to claim 4, wherein a slope angle of a side of the spacer wall is $\alpha$, and a preferred setting range of the slope angle $\alpha$ is $80°\leq\alpha<90°$.

6. The flexible OLED display panel according to claim 1, wherein the pixel unit includes a thin-film transistor and an organic light-emitting diode electrically connected to each other, the thin-film transistor is formed on the water-oxygen barrier layer, and the organic light-emitting diode is located on the thin-film transistor.

7. The flexible OLED display panel according to claim 6, wherein the thin-film transistor comprises:
   an active layer formed on the water-oxygen barrier layer;
   a gate insulation layer covered on the active layer;
   a gate electrode formed on the gate insulation layer;

an interlayer dielectric layer covered on the gate electrode;
a source electrode and a drain electrode formed on the interlayer dielectric layer; and
a planarization layer disposed on the source electrode and the drain electrode.

8. The flexible OLED display panel according to claim 6, wherein the organic light-emitting diode comprises:
a first electrode formed on the thin-film transistor and electrically connected to the thin-film transistor;
a pixel definition layer disposed around the first electrode;
an organic light-emitting layer formed on the first electrode; and
a second electrode formed on the organic light-emitting layer.

9. A manufacturing method for flexible OLED display panel, comprising steps of:
forming an organic material film layer on a flexible substrate;
using a photolithography process to etch the organic material film layer to form a water-oxygen barrier layer and multiple patterned spacer walls protruding on the water-oxygen barrier layer;
preparing multiple pixel units arranged as a matrix on the water-oxygen barrier layer, and any two adjacent pixel units are spaced apart from each other by the spacer wall; and
forming a thin-film encapsulation layer on the multiple pixel units; and
wherein the thin-film encapsulation layer is located on a top side of the multiple pixel units and the water-oxygen barrier layer is located on a bottom side of the multiple pixel units that is opposite to the top side; and
wherein the spacer wall has a lower end connected to the water-oxygen barrier layer located on the bottom side of the multiple pixel units, and the spacer wall has an upper end extended beyond the multiple pixel units to connect to the thin-film encapsulation layer located on the top side of the multiple units.

10. The manufacturing method for flexible OLED display panel according to claim 9, wherein the thin-film encapsulation layer includes an organic thin-film layer and an inorganic thin-film layer which are alternately laminated, and the spacer wall is embedded into the thin-film encapsulation layer.

11. The manufacturing method for flexible OLED display panel according to claim 9, wherein a longitudinal cross section of the spacer wall has a trapezoidal shape.

12. The manufacturing method for flexible OLED display panel according to claim 11, wherein a slope angle of a side of the spacer wall is α, and a preferred setting range of the slope a is $80°≤α<90°$.

13. A display device, comprising:
a driving unit and an OLED display panel, wherein the driving unit provides a driving signal to the OLED display panel to enable the OLED display panel to display an image;
wherein the flexible OLED display panel comprises: a flexible substrate, multiple pixel units disposed on the flexible substrate and arranged as a matrix, and a thin-film encapsulation layer covering on the multiple pixel units, wherein the flexible substrate is provided with a water-oxygen barrier layer, the multiple pixel units are located on the water-oxygen barrier layer, a spacer wall is disposed between any two adjacent pixel units, the spacer wall is integrally formed with the water-oxygen barrier layer, in a thickness direction of a flexible OLED display panel, and the spacer wall is extended to the thin-film encapsulation layer from the water-oxygen barrier layer; and
wherein the thin-film encapsulation layer is located on a top side of the multiple pixel units and the water-oxygen barrier layer is located on a bottom side of the multiple pixel units that is opposite to the top side; and
wherein the spacer wall has a lower end connected to the water-oxygen barrier layer located on the bottom side of the multiple pixel units, and the spacer wall has an upper end extended beyond the multiple pixel units to connect to the thin-film encapsulation layer located on the top side of the multiple units.

14. The display device according to claim 13, wherein the thin-film encapsulation layer includes an organic thin-film layer and an inorganic thin-film layer which are alternately laminated, and the spacer wall is embedded into the thin-film encapsulation layer.

15. The display device according to claim 13, wherein materials of the water-oxygen barrier layer and the spacer wall are both organic materials.

16. The display device according to claim 13, wherein a longitudinal cross section of the spacer wall has a trapezoidal shape.

17. The display device according to claim 16, wherein a slope angle of a side of the spacer wall is α, and a preferred setting range of the slope a is $80°≤α<90°$.

18. The display device according to claim 13, wherein the pixel unit includes a thin-film transistor and an organic light-emitting diode electrically connected to each other, the thin-film transistor is formed on the water-oxygen barrier layer, and the organic light-emitting diode is located on the thin-film transistor.

19. The display device according to claim 18, wherein the thin-film transistor comprises:
an active layer formed on the water-oxygen barrier layer;
a gate insulation layer covered on the active layer;
a gate electrode formed on the gate insulation layer;
an interlayer dielectric layer covered on the gate electrode;
a source electrode and a drain electrode formed on the interlayer dielectric layer; and
a planarization layer disposed on the source electrode and the drain electrode.

20. The display device according to claim 18, wherein the organic light-emitting diode comprises:
a first electrode formed on the thin-film transistor and electrically connected to the thin-film transistor;
a pixel definition layer disposed around the first electrode;
an organic light-emitting layer formed on the first electrode; and
a second electrode formed on the organic light-emitting layer.

* * * * *